United States Patent [19]

Kawanabe et al.

[11] 4,086,588
[45] Apr. 25, 1978

[54] SIGNAL GENERATOR

[75] Inventors: Tsuyoshi Kawanabe, Yokohama; Minoru Machida, Tokyo, both of Japan

[73] Assignee: Canon Kabushiki Kaisha, Tokyo, Japan

[21] Appl. No.: 576,269

[22] Filed: May 12, 1975

Related U.S. Application Data

[63] Continuation of Ser. No. 365,212, May 30, 1973.

[30] Foreign Application Priority Data

Jun. 2, 1972  Japan .................................. 47-54948
Jun. 22, 1972 Japan .................................. 47-73907

[51] Int. Cl.² .......................... G06F 3/02; G08C 25/00
[52] U.S. Cl. ................................. 340/365 S; 340/337; 340/365 E
[58] Field of Search ................ 340/365 E, 365 S, 337, 340/336

[56] References Cited

U.S. PATENT DOCUMENTS

| 3,179,883 | 4/1965  | Farrow  | 340/324 AD |
| 3,448,254 | 6/1969  | Verhoeff | 340/365 E |
| 3,495,232 | 2/1970  | Wagner  | 340/336 |
| 3,623,082 | 11/1971 | Stein   | 340/365 S |
| 3,715,746 | 2/1973  | Hatano  | 340/365 S |
| 3,735,395 | 5/1973  | Iwabuchi | 340/337 |
| 3,755,806 | 8/1973  | Bunting | 340/336 |
| 3,851,328 | 11/1974 | Sottile | 340/337 |
| 3,868,681 | 2/1975  | Ohyama  | 340/365 S |

Primary Examiner—John W. Caldwell, Sr.
Assistant Examiner—James J. Groody
Attorney, Agent, or Firm—Fitzpatrick, Cella, Harper & Scinto

[57] ABSTRACT

A signal generator generates different input signals when the keys are depressed. The signal generator comprises an input signal generating circuit and a double-key-depression detecting circuit. The input signal generating circuit includes a shift register having a plurality of shift stages and the associated output lines, signal lines for transmitting signals which may be sequentially derived from the output lines of the shift stages, and a discriminator for discriminating through which signal-line is transmitted the signal.

Each output of the shift stages of the shift register provides one information representative of a depressed key. Output of the discriminator provides another information representative of a depressed key. The input signal is identified by the combination of two kinds of the information.

16 Claims, 6 Drawing Figures

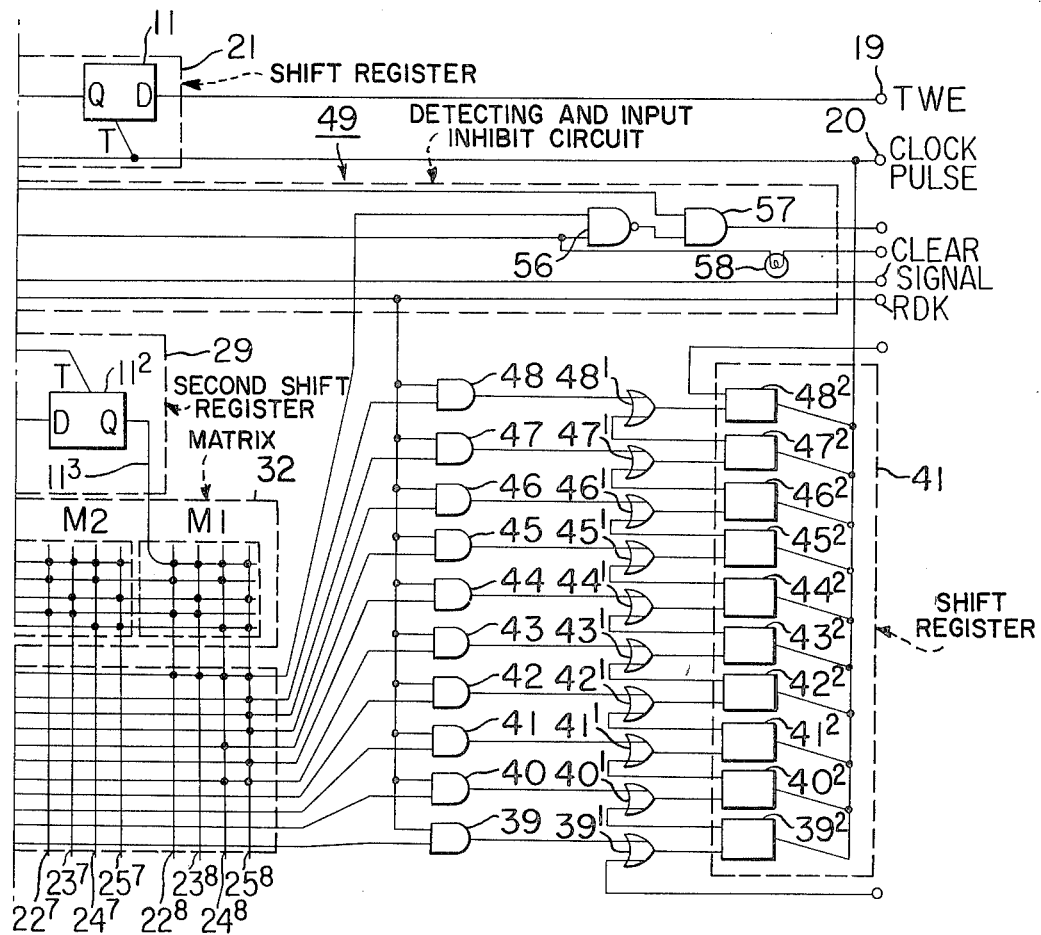

SIGNAL GENERATOR

This is a continuation of application Ser. No. 365,212, filed May 30, 1973.

BACKGROUND OF THE INVENTION

1. Field of the Invention

The present invention relates to a signal generator of the type having a plurality of keys in which the different signals are generated when the keys are depressed, and more particularly a signal generator of the type generating the signals including the timing signals when the keys are depressed.

2. Description of the Prior Art

A plurality of keys are arrayed on a keyboard in order to enter the input information into an electronic desktop calculator. The keyboard generates the specific signal depending upon a key depressed. One of the requirements for a signal generator incorporated in the keyboard is that the signal lines for transmitting the signals generated by the signal generator is reduced in number. In the conventional signal generators, the signal lines are provided for all of the key switches so that when one of the key switches is closed the DC signal may be derived through the signal line connected to the closed key switch. Therefore, the number of signal lines is increased as the number of key or key switches is increased.

SUMMARY OF THE INVENTION

One of the objects of the present invention is therefore to provide a signal generator in which the number of signal lines for transmitting the signals generated when the keys are depressed may be reduced.

Another object of the present invention is to provide a signal generator in which the number of signal lines may be reduced by the fact that the signals transmitted through the signal lines are not the DC signals.

Another object of the present invention is to provide a signal generator in which not only the number of signal lines is reduced, but also the erratic operation of the keys on a keyboard may be prevented.

Another object of the present invention is to provide a signal generator especially adapted for use with an electronic desktop calculator of the type having an indicator so that the number of components may be reduced.

The above and other objects, features and advantages of the present invention will become more apparent from the following description of one preferred embodiment thereof taken in conjunction with the accompanying drawings.

BRIEF DESCRIPTION OF THE DRAWINGS

FIGS. 1A-1D are circuit diagrams of a signal generator in accordance with the present invention, wherein FIGS. 1A and 1C, when combined, constitute a schematic diagram of the circuit, and wherein FIG. 1D constitutes a block diagram of the circuitry illustrated in the schematic;

DESCRIPTION OF THE PREFERRED EMBODIMENTS

Figure 1A:
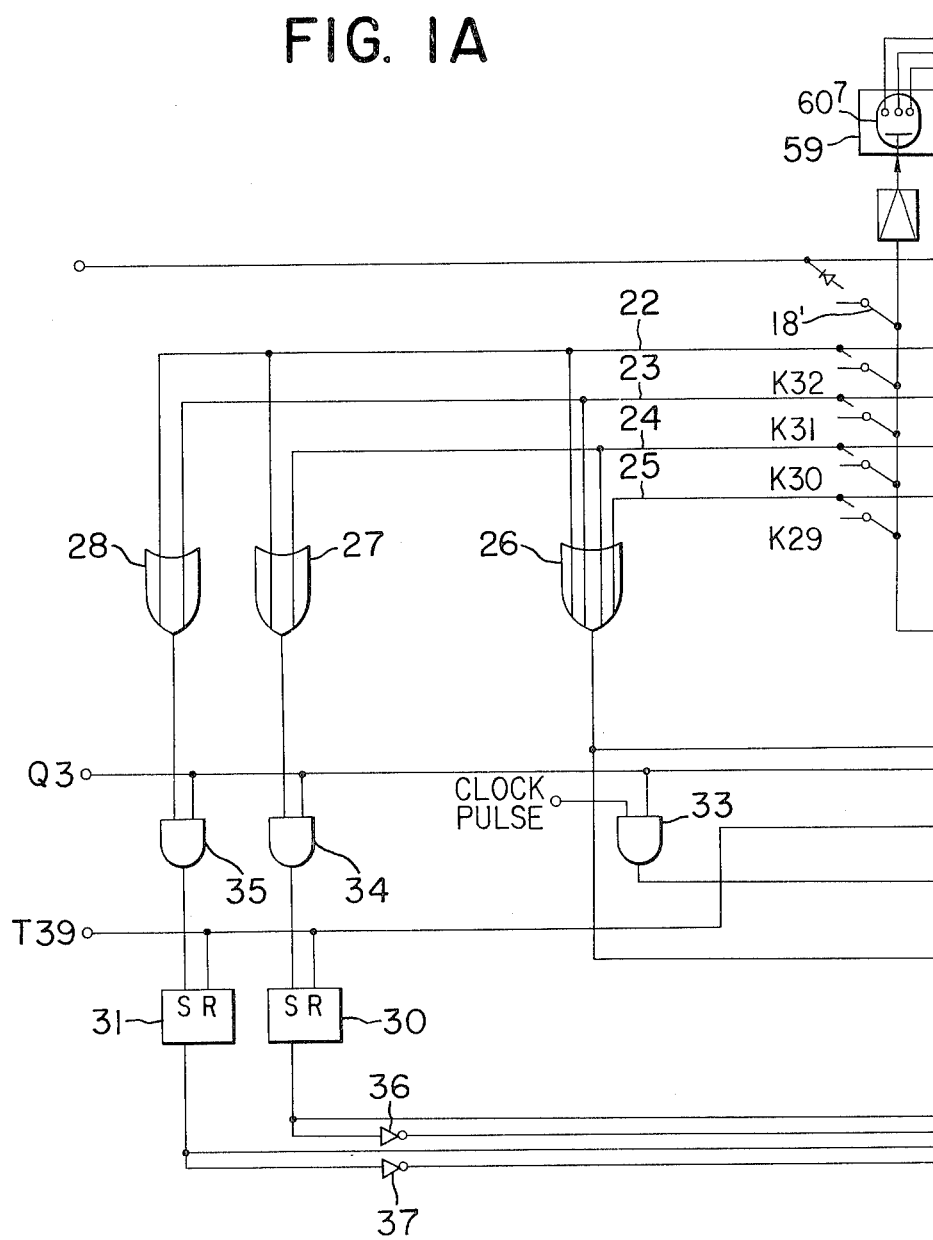
Figure 1B:
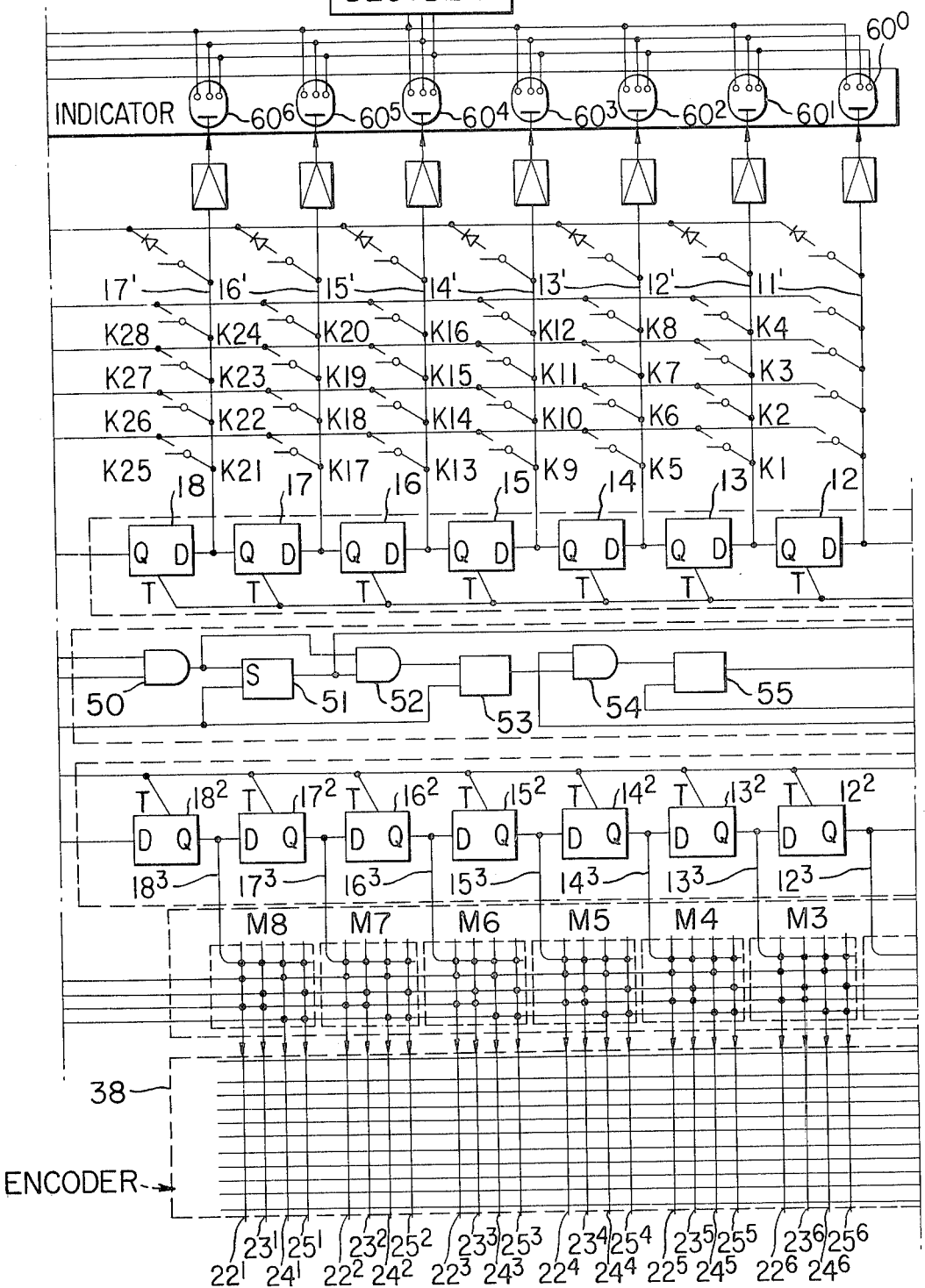

The detailed circuitry illustrated in FIGS. 1A-1C is depicted in block diagram form in FIG. 1D wherein the data input device of the present invention is shown as comprising a sequential pulse generator 21 having outputs connected to distribute pulses sequentially to the column conductors of a keyboard matrix, wherein the column conductors are coupled to sequentially energize separate display elements. The row conductors of the keyboard matrix are coupled to data entry circuitry through a row discriminator which identifies the row of a depressed key, corresponding to elements 27, 28, 30, 31 and 34-37 shown in the schematic portion FIG. 1A, and also through an OR circuit 26 to a column discriminator 29 which identifies the column of a depressed key. The outputs of the row discriminator and the column discriminator 29 are connected as inputs to a decoder 32, which identifies the depressed key the output of which is coupled through an encoder 38 to the next stage of the data entry circuitry. By these means, the number of signal lines are decreased as compared to the prior art, since as stated above there is no need to provide signal lines for all of the keyboard switches as in the prior art.

Figure 1A:
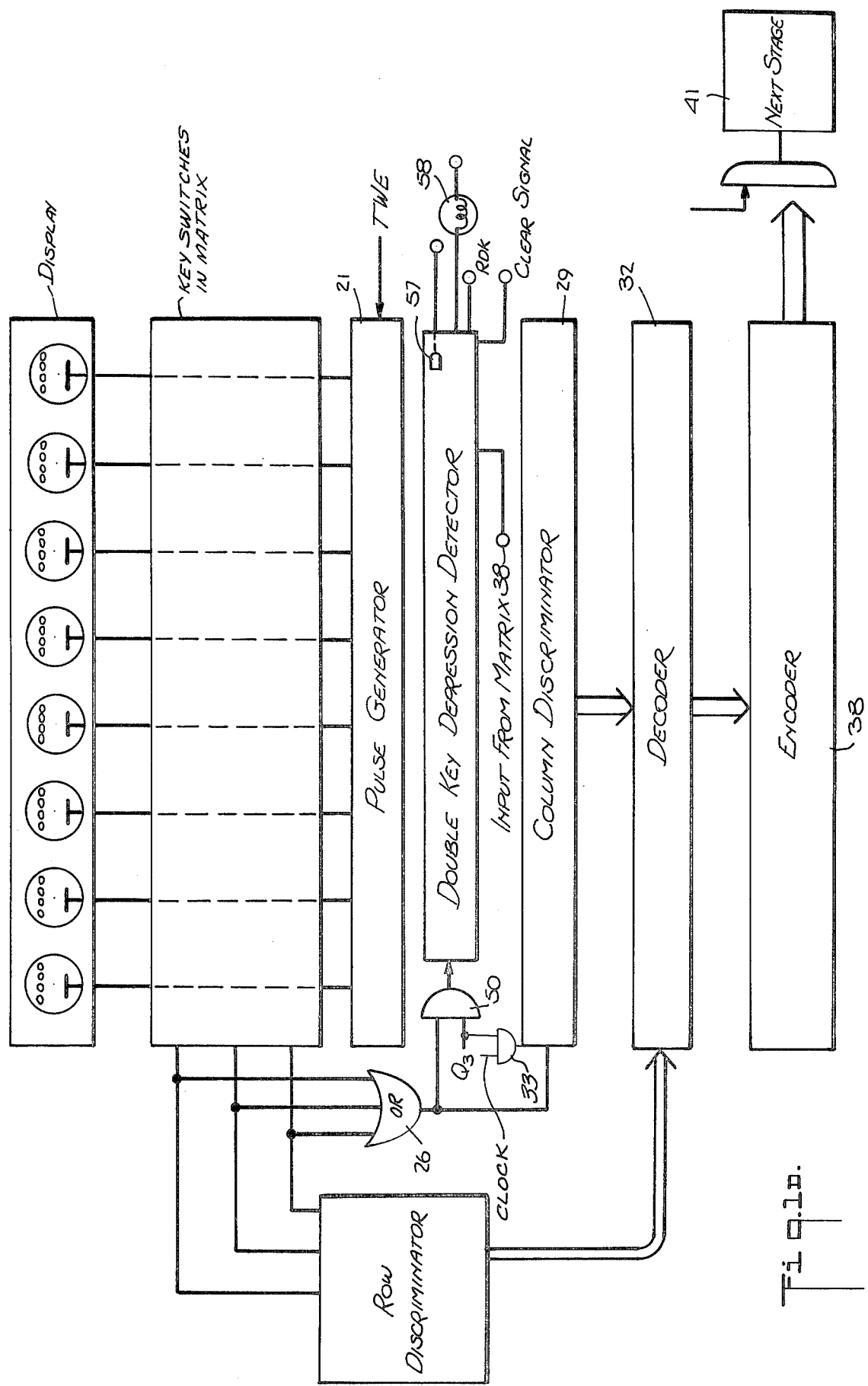

Referring now to FIG. 1, A, B and C, a shift register 21 comprises memory cells such as flip-flops 11-18 interconnected in such a manner that the output terminal Q of a preceding stage is connected to the input terminal of the next stage. The input terminal D of the first stage is connected to a terminal 19 to which is applied a start pulse TWE. The terminals T of the flip-flops 11-18 are all connected to a terminal 20 to which is applied the shift or clock pulses. The output terminals 11'-18' of the flip-flops 11-18 are connected to four signal lines 22-25 through keys K1-K32.

Figure 2:
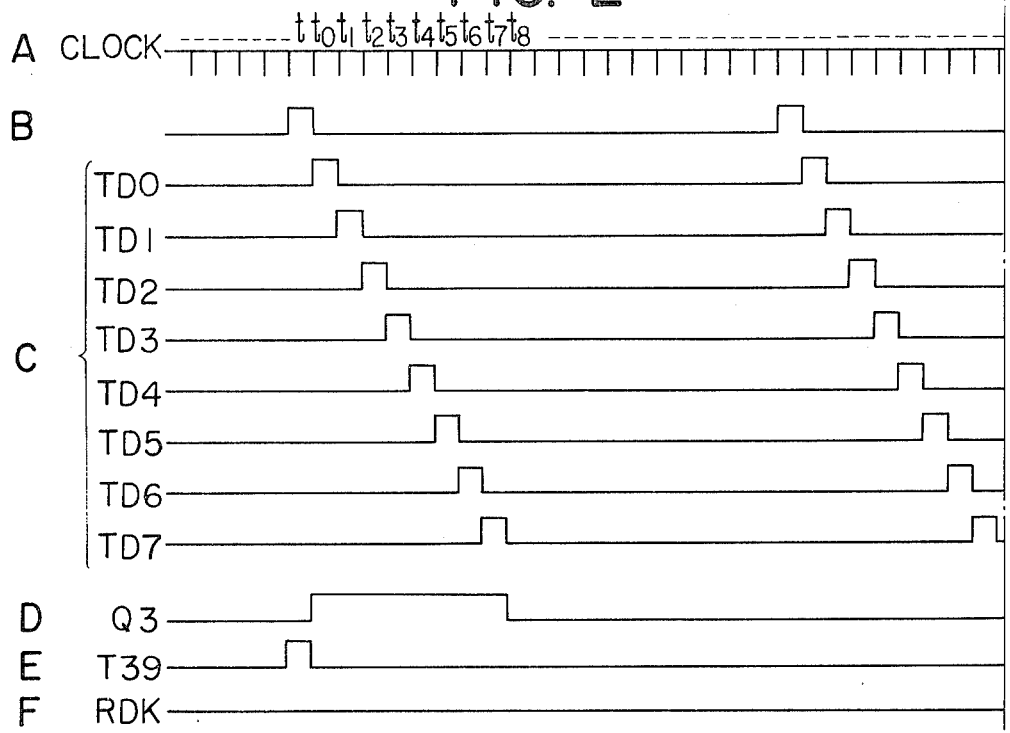
FIG. 2 illustrates the various signal waveforms used for the explanation of the mode of operation thereof.

Next referring to FIG. 2, the mode of operation of the shift register 21 with the above construction will be described. When the start pulses TWE shown at (B) in FIG. 2 are applied to the terminal 19 whereas the shift or clock pulses as shown at (a) in FIG. 2 are applied to the terminal 20, the timing signals as shown at TD0-TD7 in FIG. 2 (C) are sequentially derived from the output terminals or lines 11'-18' of the stages of the shift register 21. That is, the timing signal TD0 is derived from the output line 11'; the timing signal TD1, from the output line 12'; and so on. When one of the keys K1-K32 is depressed, the timing signal(one of the timing signals TD0-TD7) is applied to one of the signal lines 22-25 from one of the output lines 11'-18' to which is connected the depressed key K. For example when any one of the key K1-K4 is depressed, the timing signal TD0 appears on associated one of the signal lines 22-25. In like manner when any one of the keys K5-K8 is depressed, the timing signal TD1 appears on associated one of the signal lines 22-25.

Referring back to FIG. 1, A, B, and C, the signal lines 22-25 are connected to the input of an OR gate 26; the signal lines 22 and 24 are connected to an OR gate 28. The OR gate 27 and 28 are used to discriminate on which signal line appears the timing signal. For example when the output signals are derived simultaneously from the OR gates 27 and 28, the timing signal appears on the signal line 22. When the output is derived only from the OR gate 27, the timing signal appears on the signal line 24. When the output signal is derived only from the OR gate 28, the timing signal appears on the signal line 23. When there is no output signal from neither of the OR gates 27 and 28, the timing signal appears on the signal line 25. As a result one of the keys K1–K32 which is depressed may be detected from the outputs of the OR gates 26, 27 and 28. For example when the timing signal TD0 is derived from the OR gate 26, but no output signal is derived from neither of the OR gates 27 and 28, it is found out that the key K1 is depressed. When the timing signal TD1 is derived from the OR gate 26, and signal is derived from both the OR gates 27 and 28, it is found out that the key K8 is depressed.

It should be noted the signals generated when the key is depressed consist not only of the DC component but also the timing signals TD0–TD7 so that the number of signal lines may be reduced. That is, the signals for discriminating 32 signals of the keys K1–K32 may be derived from only four signal lines 22–25. Even when the lines 19 and 20 of the shift register 21 through which the start pulses TWE and shift or clock pulses are applied are added, only six signal lines are used. Furthermore when the output lines of the OR gates 26–28 are used instead of the signal lines 22–25, the number of signal lines required for discriminating the 32 key signals may be further reduced. That is, only five signal lines are required when the output lines of the OR gates 26–28 are used in order to discriminate the 32 key signals.

It should be noted that the shift register 21 is not necessarily required when a shift register used in the conventional display device or indicator for generating the carry pulses in order to dynamically drive the display device is used. An indicator 59 is used in order to indicate or display an operand or the result of arithmatic operation. In case of the conventional indicator, the indicator lamps(in the instant embodiment the cold cathode discharge tubes) $60^0$–$60^7$ are not simultaneously turned on in order to indicate a number, but they are sequentially turned on from one digit to next digit in order to indicate a number digit by digit. Therefore the indicator 59 generally comprises digit pulse lines for transmitting the digit pulses in order to sequentially turn on the indicator lamps, the connection lines 61 each interconnecting the electrodes of the indicator lamps for displaying the same numeral, and a decoder 62 for applying the signals to the indicator lamps through the connection lines 61. According to the present invention, the digit pulses are also used as timing signals TD0–TD7 so that the construction of the signal generator may be further simplified.

The output signals which are derived from the OR gates 26, 27 and 28 in order to discriminate the depressed key K, are applied to a second shift register 29 and flip-flops 30 and 31, respectively, the output signals of which are applied to a matrix 32 for discriminating or decoding the signal representing the depressed key K.

The second shift register 29 to which is applied the output signal of the OR gate 26, that is the timing signals TD0–TD7, generally comprises eight series-connected memory cells $11^2$–$18^2$, and the clock pulses are applied to the terminals T of the memory cells. When one of the keys K1–K32 is depressed and the shift pulses are applied to the shift registers 21 and 29, one of the memory cells $11^2$–$18^2$ corresponding to the depressed key K gives the output signal. For example when the key K15 is depressed, the output line 14' of the fourth stage in the shift register 21 is connected to the signal or output line 23 so that the timing signal TD3 shown at C in FIG. 2 is derived from the OR gate 26 whereas the output signal is also derived from the OR gate 28. The is, when the key K15 is depressed, the timing signal TD3 appears on the signal or output line 23 after four shift pulses have been applied. The timing signal TD3 is applied through the gate 26 to the first stage or memory cell $18^2$ of the second shift register 29 to which have been already applied four shift pulses. Thus when the fourth shift pulse is applied, the output signal is derived from the memory cell $18^2$.

When the fifth pulse is applied to both first and second shift registers 21 and 29, the output of the shift register 21 is not derived through the OR gate 26, but the information stored in the shift register 29 is shifted by one step so that the output signal may be derived from the second memory cell $17^2$.

In like manner in response to the shift pulses, the content of the second shift register 29 is shifted sequentially to right, and when the eighth shift pulse is applied, the output signal is derived from the memory cell $14^2$ of the second shift register 29. The signal Q3 applied to one input terminal of an AND gate 33 has a pulse duration from $t_0$ to $t_7$ as shown at D in FIG. 2 so that the shift pulses after the eighth shift pulse are not applied to the shift register 29. As a result the output is continuously derived from the memory cell $14^2$.

As described hereinbefore, the timing signal from the first shift register 21 is applied to the second shift register to which are applied the shift pulses for a period equal to the pulse width of the signal Q3. Therefore when the output signal appears on the output line $11^1$, then the output signal is derived from the output line $11^3$ of the memory cell $11^2$ of the second shift register 29. In like manner, when the output signal appears on the output line $12^1$, the output signal is also derived from the output line $12^3$, and so on.

The output signals of the OR gates 27 and 28 are applied to one input terminals of the AND gates 34 and 35 respectively to the other input terminals of which are applied the signal Q3, and the output signals of the AND gates 34 and 35 are applied to the set input terminals S of the flip-flops 30 and 31, respectively, and the output terminals of the flip-flops 30 and 31 are connected to the matrix 32 directly and through invertors 36 and 37, respectively. These four input leads are combined with the output lines $11^3$–$18^3$ of the shift register 29 and with the output lines or leads $22^1$–$25^1$, $22^2$–$25^2$, ..., and $22^8$–$25^8$, thereby forming matrix circuits M1–M8 as shown in FIG. 1. The output signal corresponding to that on the output line 22 is derived from the output lines $22^n$ (where $n = 1$ to 8); the output signal corresponding to that on the output line 23 is derived from the output lines $23^n$ (where $n = 1$ to 8); the output signal corresponding to that on the output line 24 is derived from the output lines $24^n$ (where $n = 1$ to 8); and the output signal corresponding to that on the output line 25 is derived from the output lines $25^n$ (where $n = 1$ to 8).

Thus when the key is depressed, the output is derived from one of the output lines $22^n$, $23^n$, $24^n$ and $25^n$ ($n = 1$ to 8) of the matrixes M1–M8. In other words, the output signal derived from a specific output line indicates which key is being depressed. For example when the key K15 is depressed, the output signal is derived from the output line $23^3$. The flip-flops 30 and 31 are adapted to be reset in response to the signals T39 as shown at E in FIG. 2.

In the instant embodiment, the output signal representing the depressed key is further applied a matrix circuit 38 (whose cores are not shown) in order to obtain an address instruction signal for Read-Only-Memory (hereinafter referred to as ROM). The output signals of the matrix 38 are applied to AND gates 39-48, to which is applied the read-key-command shown at F in FIG. 2, so that they may converted into the codes representing the addresses for ROM by the encoder 38 and set into a sequence controller 41 of ROM. Then they transferred in parallel into memory cells $39^2$-$48^2$ of the shift register 41 through OR gates $39^1$-$48^1$, and the clock or shift pulses are applied from the terminal 20 to the shift register (sequence controller) 41 so that the coded signals may be obtained in serial. Thus the control of ROM is started.

Next a double-key-depression detecting circuit and an input inhibit circuit generally indicated by 49 will be described hereinafter. The timing signals transferred through the OR gate 26 is applied to an AND gate 50 to which is applied the Q3 signal shown at D in FIG. 2. In response to the output of the AND gate 50, a flip-flop 51 is set. The output of the AND gate 50 is further applied to an AND gate 52 the output of which sets a flip-flop 53. The flip-flop 53 is set when two keys are depressed simultaneously giving the output signal, which is applied to an AND gate 54 to which is applied the read-key-command RDK shown at F in FIG. 2 and whose output signal sets a flip-flop 55. The output signal of the flip-flop 55 is used to turn on an indicator lamp 58 which indicates that two keys are depressed simultaneously.

Next the mode of operation will be described in detail when the keys K1 and K9 are depressed simultaneously. In response to the depression of the key K1, the timing signal TD0 is applied from the OR gate 26 through the AND gate 50 to the flip-flop 51 so that the flip-flop 51 is set. The set output signal is applied to the gate 52 but no output signal is applied thereto from the gate 50, so that the gate 52 remains closed. The set output of the flip-flop 51 is remained until the reset signal T39 is applied, but when the key K9, upon a double-key-depression, is depressed and the timing signal TD2 is applied before the reset signal T39 is applied, the AND gate 52 gives the output signal in response to which the flip-flop 53 is set to give the set output to the gate 54. Since the read-key-command RDK is applied to the gate 54, the flip-flop 55 is set in response to the output of the gate 54 so that the indicator lamp 58 is turned on. Even when the reset signal T39 is applied, the flip-flops 51 and 53 are only reset, but the flip-flop 55 will not be reset so that the indicator lamp 58 remains turned on. The indicator lamp 58 is turned off in response to the reset of the flip-flop 55 which in turn is effected in response to a clear signal generated when a clear key is depressed.

The set output signal of the flip-flop 55 is applied one input terminal of a NAND gate 56 to the other input terminal of which is applied the signal from the encoder 38. It should be noted that the matrix is so arranged that when the functional keys such as CM, CE, RE, T keys are depressed, no signal is derived therefrom. The output signal of the NAND gate 56 is applied to one input terminal of an AND gate 57 to the other input terminal of which is applied the set output signal of the flip-flop 51, and the output signal of the AND gate 57 is used as an command signal for stepping ROM. That is, when the output signal of the AND gate 57 is "0," ROM is not stepped and is electronically locked.

Therefore when the keys K1 and K9 are simultaneously depressed, the flip-flop 55 is set so that the signal "1" is applied to one input terminal of the NAND gate 56 whereas the signal "1" from the matrix 38 is applied to the other input terminal. As a result the output signal "0" of the NAND gate 56 is applied to one input terminal of the AND gate 57. Under these conditions the flip-flop 51 is set so that the output signal of the gate 57 is "0." As a result the step of the ROM is inhibited whereby no writing is accomplished. In other words, the input is electronically locked. When only the key K1 is depressed, the input signals applied to the NAND gate 56 are "0" and "1" whereas the input signals to the gate 57 are both "1" so that its output signal is "1." As a result ROM is stepped.

As described hereinbefore, when the keys K1 and K9, which generate the different timing signals TD0 and TD2, are simultaneously depressed, their inputs may be effectively inhibited, but when the keys, which generate the same timing signal, are simultaneously depressed, the input of the timing signals cannot be inhibited but they are erroneously entered. For example when the keys K1 and K2 are simultaneously depressed, the output signals appear simultaneously not only on the output line $25^8$ but also on the output line $24^8$ and are transferred into the shift register 41.

Figure 3:
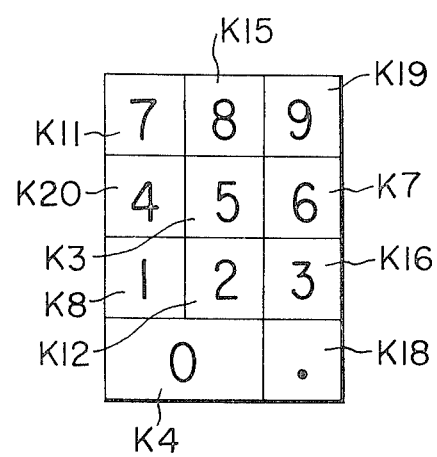
FIG. 3 is a top view of a keyboard thereof.

In general the double key depression is caused by simultaneously depressing the adjacent keys. In order to overcome this problem, the keys in the signal generator in accordance with the present invention are so arranged that the adjacent keys will not generate the same timing signal. This arrangement will be described with reference to FIG. 3 illustrating an array of keys and the generation of the timing signals. As is clear from FIG. 3, the keys K3 and K4, which generate the same timing signal TD0, are spaced apart from each other as the keys for entering "5" and "0", respectively. In like manner the keys K7 and K8, which generate the same timing signal TD1, are spaced apart from each other as the keys for entering "6" and "1," respectively, and same is true for the other keys. Thus, the erroneous entery of input by simultaneously depressing two keys may be prevented completely.

We claim:
1. A data input device comprising:
 (a) a plurality of key switches arranged in a matrix configuration, said matrix being provided with at least one row line and a plurality of column lines, wherein said switches are connected respectively at each of the intersections between one row line and one column line;
 (b) pulse generator means for distributing pulse signals to each of said column lines in succession during a predetermined time interval, said pulse generator means including a first register consisting of a plurality of memory elements each having an output connected to a respective one of said column lines, and means for differentiating the condition of at least one of said memory elements from the condition of the remaining memory elements;
 (c) column line discriminator means operable in response to actuation to one of said key switches for identifying the column line to which said actuated key switch is connected, said column line discriminator means comprising a second register and means for coupling the signal from said pulse distributor through the operated one of said key switches to said second register, wherein said sec- ond register includes a plurality of memory elements for storing the signal coupled thereto;
(d) row line discriminator means having a plurality of memory elements for identifying a row line on which the signal is developed when any one of said key switches coupled to said row line is depressed; and
(e) means for decoding outputs from said row and column line discriminator means to identify which one of said key switches is depressed in accordance with the combination of output signals from said second register of said column line discriminator means and output signals from said memory elements of said row line discriminator means.

2. A data input device as set forth in claim 1, wherein said plurality of memory elements in said row line discriminator means comprises a plurality of flip-flops.

3. A data input device as set forth in claim 1, which further comprises means for detecting actuation of two of said key switches during said predetermined time interval of sequentially timed output pulses.

4. A data input device as set forth in claim 3, which further comprises means responsive to an output from said detecting means for providing a data entry inhibit signal.

5. A data input device comprising:
(a) a plurality of key switches arranged in a matrix configuration, said matrix being provided with at least one row line and a plurality of column lines, wherein said switches are connected respectively at each of the intersections between one row line and one column line;
(b) pulse generator means for distributing pulse signals to each of said column lines in succession during a predetermined time interval, said pulse generator means including a first shift register consisting of a plurality of memory element stages, wherein said stages are connected together in cascade configuration, and each stage has an output connected to a respective one of said column lines;
(c) row line discriminator means for identifying a row line on which the signal is developed when any key switch coupled to said row line is depressed, said row line discriminator means comprising coding means for producing coded signals on signal lines, the number of which is smaller than that of said row lines;
(d) column line discriminator means for identifying the column line to which the depressed key switch is coupled, said column line discriminator means comprising a second shift register consisting of a plurality of stages, the number of which being equal to that of said first shift register, wherein said stages are connected together in cascade configuration;
(e) OR gate means for applying a signal which is developed on any row line by the depression of the key switch to an input terminal of said second shift register;
(f) decoder means for identifying the depressed key switch, said decoder means having inputs coupled to each stage of said second shift register and to said row line coding means;
(g) means for applying shift pulses to said first and second shift registers; and
(h) encoder means including a matrix circuit for producing signals coded in accordance with the output of said decoder.

6. A data input device as set forth in claim 5, wherein said row line discriminator means comprises memory elements for storing the signal developed on a said row line.

7. A data input device as set forth in claim 5, which further comprises means for detecting actuation of two of said key switches during the predetermined interval of sequentially timed output pulses.

8. A data input device as set forth in claim 7, which further comprises means responsive to an output from said detecting means for providing a data entry inhibit signal.

9. A data input device comprising:
(a) a plurality of key switches arranged in a matrix configuration, said matrix being provided with at least one row line and a plurality of column lines, wherein said switches are connected respectively at each of the intersections between one row line and one column line;
(b) pulse generator means for distributing pulse signals to each of said column lines in succession during a predetermined time interval, said pulse generator means including a first register consisting of a plurality of memory elements each having an output connected to a respective one of said column lines, and means for differentiating the condition of at least one of said memory elements from the condition of the remaining memory elements;
(c) means for supplying information signals to be displayed, and a display unit having a plurality of display elements connected to said outputs of said pulse generator means wherein said pulses energize said elements to provide display representations in response to the information signals applied thereto;
(d) column line discriminator means operable in response to actuation of one of said key switches for identifying the column lines to which said actuated key switch is connected, said column line discriminator means comprising a second register and means for coupling the signal from said pulse generator means through the operated one of said key switches to said second register, wherein said second register includes a plurality of memory elements for storing the signal coupled thereto;
(e) row line discriminator means having a plurality of memory elements for identifying a row line on which the signal is developed when any one of said key switches coupled to said row line is depressed; and
(f) means for decoding outputs from said row and column line discriminator means to identify which one of said key switches is depressed in accordance with the combination of output signals from said second register of said column line discriminator means and output signals from said memory elements of said row line discriminator means.

10. A data input device as set forth in claim 9, wherein said plurality of memory elements in said row line discriminator means comprises a plurality of flip-flops.

11. A data input device as set forth in claim 9, which further comprises means for detecting actuation of two of said key switches during said predetermined time interval of sequentially timed output pulses.

12. A data input device as set forth in claim 11, which further comprises means responsive to an output from said detecting means for providing a data entry inhibit signal.

13. A data input device as set forth in claim 11, wherein said detecting means comprises a flip-flop having an input coupled to receive signals developed on the row lines for a predetermined time period and settable in response to reception of two signals.

14. A data input device as set forth in claim 9, which further comprises key switch encoder means responsive to an output of said decoding means for generating different information signals corresponding to actuation of said respective key switches.

15. A data input device as set forth in claim 14, further comprising a third register operative to store said different information signals produced by said key switch encoder means, and means coupled to said key switch encoder means and to said third register for preventing the transfer of said information signals to said third register when the signals are produced in response to the simultaneous depression of two of said key switches, each of which corresponds to numerical information including numerals and a decimal point.

16. A data input device as set forth in claim 15, wherein said key switch encoder means comprises a matrix arrayed circuit, and wherein said signal transfer preventing means includes means to allow the transfer of said information signals to said third register in response to the depression of a particular one of said key switches.

* * * * *

UNITED STATES PATENT OFFICE
CERTIFICATE OF CORRECTION

Patent No. 4,086,588                    Dated April 25, 1978

Inventor(s) Tsuyoshi Kawanabe and Minoru Machida

It is certified that error appears in the above-identified patent and that said Letters Patent are hereby corrected as shown below:

| | |
|---|---|
| Column 2, line 60 | Change "28." to --27; and the signal lines 22 and 23 are connected to an OR gate 28.--. |
| line 61 | Change "gate" to --gates--. |
| 6, line 62 | Change "to" (Second Occurrence) to --of--. |

Signed and Sealed this

Thirty-first Day of October 1978

[SEAL]

Attest:

RUTH C. MASON
Attesting Officer

DONALD W. BANNER
Commissioner of Patents and Trademarks